(12) United States Patent
Berthold et al.

(10) Patent No.: US 7,064,439 B1
(45) Date of Patent: Jun. 20, 2006

(54) INTEGRATED ELECTRICAL CIRCUIT AND METHOD FOR FABRICATING IT

(75) Inventors: Jörg Berthold, München (DE); Siegfried Schwarzl, Neubiberg (DE)

(73) Assignee: Infineon Technologies AG, Munich (DE)

( * ) Notice: Subject to any disclaimer, the term of this patent is extended or adjusted under 35 U.S.C. 154(b) by 329 days.

(21) Appl. No.: 09/595,860

(22) Filed: Jun. 16, 2000

Related U.S. Application Data

(63) Continuation of application No. PCT/EP98/08255, filed on Dec. 16, 1998.

(30) Foreign Application Priority Data

Dec. 16, 1997 (DE) ................................ 197 55 869

(51) Int. Cl.
  H01L 23/48 (2006.01)
  H01L 23/52 (2006.01)
  H01L 29/40 (2006.01)
(52) U.S. Cl. ................. 257/758; 257/760; 257/762; 257/750; 257/751
(58) Field of Classification Search ........ 257/750–751, 257/758–765, 382–412; 438/629–639, 668–675
  See application file for complete search history.

(56) References Cited

U.S. PATENT DOCUMENTS 5,025,741 A 6/1991 Suwanai et al.
5,479,054 A * 12/1995 Tottori .................... 257/758

(Continued)

FOREIGN PATENT DOCUMENTS

| DE | 19543540 C1 | 11/1998 |
|---|---|---|
| EP | 0261846 A1 | 3/1988 |
| EP | 0751566 A2 | 1/1997 |
| JP | 6 013 381 | 1/1994 |
| JP | 6 069 353 | 3/1994 |
| JP | 9-64034 | 3/1997 |
| JP | 9064034 | 7/1997 |
| JP | 9 312 291 | 12/1997 |
| KR | 1997-0053559 | 7/1997 |

OTHER PUBLICATIONS

"Barrier Metal Free Copper Damascene Interconnection Technology Using Atmospheric Copper Reflow and Nitrogen Doping in SiOF Film", K. Mikagi et al., IEEE, 1996, pp. 365-368.

(Continued)

*Primary Examiner*—Cuong Nguyen
(74) *Attorney, Agent, or Firm*—Laurence A. Greenberg; Werner H. Stemer; Ralph E. Locher

(57) ABSTRACT

An integrated electrical circuit having a plurality of structure planes is described. Electrically active elements are situated on at least one element structure plane, where at least one insulation layer is disposed above the element structure plane. Electrical connecting leads are disposed within and/or above the insulation layer, where at least a portion of the connecting leads contain copper. At least one diffusion blocker is disposed underneath the connecting leads, which diffusion blocker impedes and/or prevents the diffusion of copper. The integrated electrical circuit is configured according to the invention such that the diffusion blocker is configured as a blocker layer which is interrupted only in the region of contact holes and/or connection pieces and that the blocker layer is situated between the element structure plane and the insulation layer.

26 Claims, 2 Drawing Sheets

U.S. PATENT DOCUMENTS

| | | | |
|---|---|---|---|
| 5,500,558 A * | 3/1996 | Hayashide | 257/758 |
| 5,552,627 A * | 9/1996 | McCollum et al. | 257/764 |
| 5,612,254 A | 3/1997 | Mu et al. | |
| 5,679,269 A * | 10/1997 | Cohen et al. | 216/72 |
| 5,723,382 A | 3/1998 | Sandhu et al. | |
| 5,739,579 A * | 4/1998 | Chiang et al. | 257/751 |
| 5,798,559 A * | 8/1998 | Bothra et al. | 257/758 |
| 5,935,766 A * | 8/1999 | Cheek | 430/316 |
| 6,008,117 A * | 12/1999 | Hong et al. | 438/639 |
| 6,060,784 A * | 5/2000 | Oda | 257/758 |

OTHER PUBLICATIONS

"Evaluation of a Copper Metallization Process and the Electrical Characteristics of Copper-Interconnected Quarter-Micron CMOS", Nobuyoshi Awaya et al., IEEE Transactions on Electron Devices, vol. 43, No. 8, Aug. 1996, pp. 1206-1212.

"Integration of copper multilevel interconnects with oxide and polymer interlevel dielectrics", Ronald J. Gutmann et al., Thin Solid Films 270, 1995, pp. 472-479.

* cited by examiner

INTEGRATED ELECTRICAL CIRCUIT AND METHOD FOR FABRICATING IT

CROSS-REFERENCE TO RELATED APPLICATION

This is a continuation of copending International Application PCT/EP98/08255, filed Dec. 16, 1998, which designated the United States.

BACKGROUND OF THE INVENTION

Field of the Invention

The invention relates to an integrated electrical circuit having a plurality of structure planes, in which electrically active elements are situated on at least one element structure plane. At least one insulation layer is disposed above the element structure plane and electrical connecting leads are disposed within and/or above the insulation layer. At least a portion of the connecting leads contains so much copper that copper is predominant for the properties of the connecting leads, and at least one diffusion blocker is disposed underneath the connecting leads, which diffusion blocker impedes and/or prevents the diffusion of copper.

The invention furthermore relates to a method for fabricating such an integrated electrical circuit.

In integrated electrical circuits, an RC element is formed from the resistance of an interconnect and its capacitance, which depends on the material surrounding it and the geometry thereof. The attenuation and resonance effects of the RC element adversely affect the signal propagation in the integrated electrical circuit. A diameter of the interconnect decreases considerably with the reduction of the feature sizes in the electrical circuit. Since, at the same time, the length of the interconnects is altered only slightly, the resistance of the interconnect increases. Therefore, undesirable resonance and attenuation effects are increased in integrated electrical circuits with smaller feature sizes.

The use of copper as a material for the interconnect has been proposed in order to solve this problem. Since copper has a higher electrical conductivity than aluminum, the resistance of the interconnect can thus be reduced.

When copper is used as a material for the interconnects, however, the problem arises that the copper has to be prevented from diffusing into the structure plane in which the electrically active elements are situated. One reason for this is that copper atoms serve as centers for the production of charge carriers in a semiconductor substrate. A lifetime of minority charge carriers is shortened by the generation of charge carriers. Moreover, the copper atoms act as seeds for oxidation-induced stacking faults and weak points in thin oxide layers. The harmfulness of the copper to the electrically active elements contained in the element structure plane is intensified by a very high diffusion rate of copper atoms in customary semiconductor materials—such as silicon. On account of the high diffusion rate, the copper atoms can diffuse through the entire semiconductor substrate at process temperatures usually starting from 400° Celsius. Therefore, irrespective of the point at which they pass into the semiconductor material, the copper atoms can readily reach the critical points at which they initiate the undesirable consequential effects mentioned above.

One solution to the problem of copper diffusion is known from the generic integrated electrical circuit described in the article titled "Barrier Metal Free Copper Damascence Interconnection Technology Using Atmospheric Copper Reflow and Nitrogen Doping in SiOF Film", K. Mikagi, et al., IEDM 1996, pp. 365–368. The article furthermore discloses a method for fabricating the integrated electrical circuit. In that case, a thin diffusion blocker is disposed directly underneath an interconnect composed of copper. The diffusion blocker is formed as follows. First a trench for accommodating the interconnect composed of copper is etched into the insulation layer. The surface of the patterned insulation layer composed of SiOF is subsequently converted superficially into SiON by nitriding in an $NH_3$ plasma. This makes it possible for the interconnect to be composed of copper in its entire cross section. The thickness of the layer serving as a diffusion blocker is small and amounts to a few nm. The barrier effect of such a layer is limited. The circuit has the disadvantage that the diffusion of copper is not reliably stopped.

Furthermore, it is known to connect different structure planes of an electrical circuit with contact holes filled with copper. In that case, the copper is enclosed on all sides by a diffusion-inhibiting barrier layer. The barrier layer has a minimum layer thickness for preventing copper from diffusing into the substrate in which it is situated. In order to effectively prevent the diffusion, the barrier layer must not fall below a certain thickness. A barrier layer thickness sufficient to prevent diffusion leads to only a small portion of the interconnect cross section being composed of copper. Since all known barrier layers have a considerably higher resistivity than copper, the effective electrical conductivity thus decreases undesirably with the progressive decrease in the width of the contact holes.

SUMMARY OF THE INVENTION

It is accordingly an object of the invention to provide an integrated electrical circuit and a method for fabricating it that overcome the above-mentioned disadvantages of the prior art devices and methods of this general type, in which as far as possible undisturbed current conduction is obtained even with small feature sizes. Resonance and attenuation effects should be as minor as possible even at a high signal frequency. Furthermore, the intention is to effectively prevent copper atoms from diffusing into the semiconductor substrate.

With the foregoing and other objects in view there is provided, in accordance with the invention, an integrated electrical circuit, including:

a plurality of structure planes including at least one element structure plane;

electrically active elements disposed on the at least one element structure plane;

at least one insulation layer disposed above the at least one element structure plane;

electrical connecting leads disposed at least one of within and above the insulation layer, at least a portion of the electrical connecting leads contain copper;

connection pieces disposed underneath the electrical connecting leads; and at least one diffusion blocker disposed underneath the electrical connecting leads, the diffusion blocker impedes and/or prevents a diffusion of copper, the diffusion blocker is configured as a blocker layer interrupted only in a region having contact holes formed therein and/or in a region of the connection pieces, the blocker layer is disposed between the at least one element structure plane and the insulation layer.

In the case of an integrated electrical circuit of the generic type, the object is achieved according to the invention by virtue of the fact that the diffusion blocker is configured as a blocker layer which is interrupted only in the region of contact holes and in that the blocker layer is situated between the element structure plane and the insulation layer.

The invention thus envisages providing an integrated electrical circuit in which a continuous layer is situated between a copper-containing connecting lead and electrically active elements, and where at least one insulation layer is situated between the continuous layer and the connecting lead.

Preferably, a diffusion barrier for copper is effective at the surface of the contact holes at least underneath the blocker layer. The diffusion barrier can be realized by filling the contact holes with a conductive material that has a diffusion barrier effect for copper. The material may be, in particular, tungsten or titanium nitride. Furthermore, the diffusion barrier may be realized by a thin layer which lines the side walls and the bottom of the contact hole and exhibits the diffusion barrier effect for copper. In particular, titanium/titanium nitride, titanium nitride, tantalum nitride or the like is suitable for the thin layer. The thin layer may be realized by an adhesion layer of the kind frequently used when contact holes are filled with tungsten. The thin layer has a thickness of 50 to 200 nm, preferably of 50 to 100 nm. The diffusion barrier at the surface of the contact holes forms, together with the blocker layer, a continuous layer with a diffusion barrier effect against copper. This effectively prevents copper atoms from passing into the semiconductor substrate. The copper-containing connecting lead is isolated from the semiconductor substrate by a closed diffusion barrier layer formed from the blocker layer and the diffusion barrier which is effective at the surface of the contact holes.

The connecting leads may be both interconnects and electrical contacts.

The interconnects preferably extend within a structure plane and serve to connect different active electrical elements to one another or to contacts located outside the actual integrated electrical circuit. They may be part of a totality of layers made of conductive and insulating materials, the layers being constructed above the active elements and being multiply patterned laterally. This totality is also referred to as a metalization layer.

Connecting leads serving as direct electrical contacts are preferably formed by contact holes filled with a conductive material. The contact holes preferably extend perpendicularly to the structure planes from which the integrated electrical circuit is constructed.

The connecting leads contain so much copper that copper is predominant for the properties of the connecting leads. In this case, it is possible, in principle, for the connecting leads to be composed completely of copper. However, it is likewise possible for the connecting leads to be formed from a material which contains copper only as a proportion and furthermore has additions for example of zirconium, hafnium or the like. However, according to the invention this proportion is so large that the copper is present in a content that suffices for considerably increasing the electrical conductivity of the material. To that end, it is expedient for the copper content in the connecting leads to be at least 10 percent by weight. In this case, copper is present in a concentration which is higher than that required to improve the process properties of the method for fabricating an interconnect, with the result that the properties, in particular the electrical conductivity, the etching behavior, the adhesion, the seeding, the deposition properties, the surface properties and the like, of the connecting leads are determined by the copper. Copper-specific processes may be necessary, therefore, during the fabrication of the connecting leads. In order to exhaust the potential of the copper-containing connecting leads, it is advantageous to provide a copper content of greater than or equal to 90 percent by weight in the connecting leads.

A diffusion blocker is situated underneath the connecting leads. However, at least one insulation layer is disposed between the connecting leads and the diffusion blocker.

The insulation layer may be constructed from any desired material. In order to obtain the smallest possible RC constant of the connecting lead, however, it is expedient for the dielectric constant of the material used for the insulation layer to be as small as possible. The smallest possible dielectric constant of the insulation layer can be obtained when the latter is composed of air or an aerogel.

However, materials that can be integrated more easily in the fabrication process also have a suitable, small dielectric constant. Examples of these materials that may be mentioned are semiconductor oxides such as $SiO_2$, semiconductor nitrides such as $Si_3N_4$, fluorinated semiconductor oxides such as SiOF, fluorinated (amorphous) carbon, nitrides such as boron nitride, polymers and polymer compounds such as polyimides, in particular fluorinated polyimides, polystyrenes, polyethylenes, polycarbonates, polybenzoxazole (PBO), benzocyclobutene (BCB), parylene, fluoropolymers such as tetrafluoroethylene.

The blocker layer is situated underneath the insulation layer. Therefore, the blocker layer is spatially separated from the connecting leads. The consequence of this configuration is that copper atoms can penetrate into the insulation layer. The invention does not, therefore, preclude partial penetration of individual copper atoms into the insulation layer. It has been shown that such minor penetration of copper atoms into the insulation layer does not adversely affect the functionality of the integrated electrical circuit.

The blocker layer serving as a diffusion blocker can, in principle, be formed from any material. A material which, at the customary process temperatures of, as a rule, in excess of 400 degrees Celsius, has a diffusion length for copper which is less than the thickness of the blocker layer is expediently used.

It is particularly advantageous for the blocker layer to contain nitrogen, oxygen, fluorine or a compound of these elements.

Examples of suitable materials for the blocker layer are nitrides such as silicon nitride $Si_3N_4$, oxidized nitrides such as, for example, silicon oxynitride SiON, silicon boron oxynitride SiBON, $TiN_xO_y$, $TaN_xO_y$, $WN_xO_y$, $WSi_xN$, fluorinated nitrides such as silicon fluorooxynitride SiOFN, and also metal oxides such as $TiO_2$, $Ta_2O_5$.

It is particularly expedient for the thickness of the blocker layer to be between 50 nm and 800 nm.

A minimum layer thickness of approximately 100 nm suffices in the majority of cases to effectively prevent copper atoms from diffusing into the plane of the electrically active elements. A possible upper limit for the layer thickness is provided by the intention of avoiding an undesirable increase in the lateral coupling capacitances and also an unfavorable geometrical shape of the insulation layer.

The invention also includes the case where a plurality of blocker layers are provided. The blocker layers may be situated on different structure planes and the extent to which they impede diffusion or prevent diffusion may differ.

It is likewise expedient for at least one further diffusion blocker to bear on at least a portion of the connecting leads.

The further diffusion blocker may be shaped as desired. It is particularly advantageous, however, for the further diffusion blocker to bear on the side areas and/or the lower edges of at least a portion of the connecting leads. This portion of the connecting leads may involve both the interconnects and the electrical contacts.

It is expedient to configure the further diffusion blocker or blockers in such a way that they prevent bulk outdiffusion of the copper into the insulation layer, and that the blocker layer impedes diffusion to a greater extent.

This configuration can be obtained in a particularly simple and expedient manner by the blocker layer being thicker than the further diffusion blocker.

In an alternative, a diffusion through the blocker layer is less than 10% of the diffusion through the further diffusion blocker.

The invention furthermore relates to a method for fabricating an integrated electrical circuit, the method includes:
forming electrically active elements in a region of a surface of a semiconductor substrate,
applying an insulation layer on the electrically active elements,
producing electrical connecting leads, which contain so much copper that copper is predominant for the properties of the connecting leads, within and/or on the insulation layer, and
applying at least one diffusion blocker underneath the connecting leads.

According to the invention, the method is carried out in such a way that before the insulation layer is produced, the diffusion blocker is deposited as a continuous blocker layer, and that the insulation layer is produced on the blocker layer.

Other features which are considered as characteristic for the invention are set forth in the appended claims.

Although the invention is illustrated and described herein as embodied in an integrated electrical circuit and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
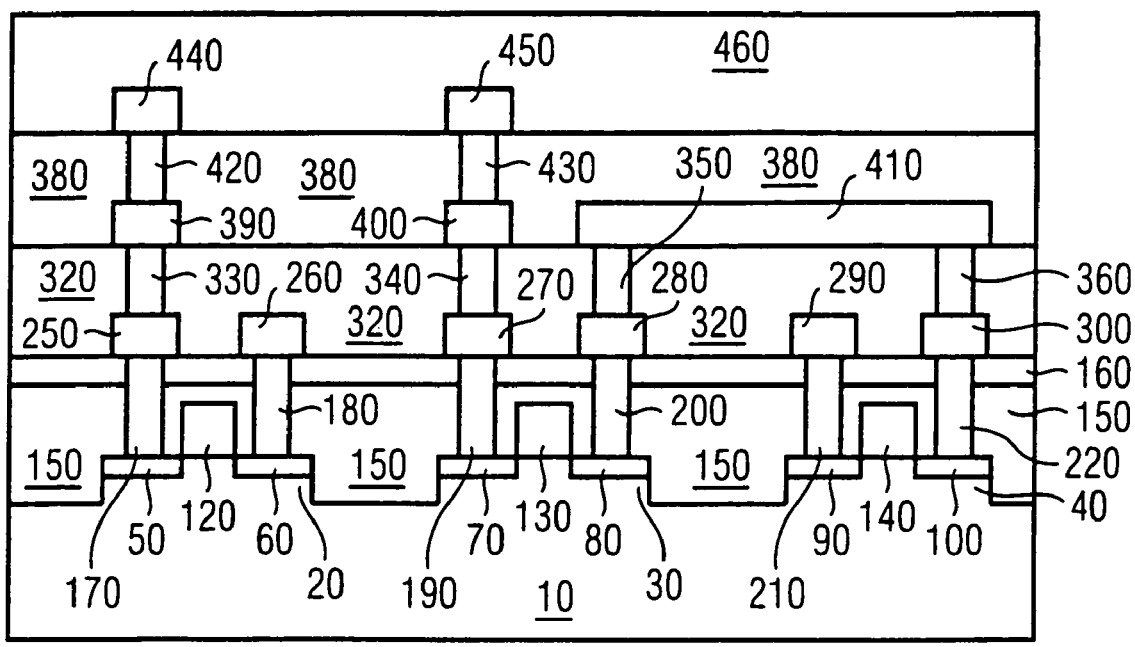
FIG. 1 is a diagrammatic, cross-sectional view through an integrated electrical circuit having a blocker layer which is interrupted by contact holes filled with tungsten according to the invention.

In all the figures of the drawing, sub-features and integral parts that correspond to one another bear the same reference symbol in each case. Referring now to the figures of the drawing in detail and first, particularly, to FIG. 1 thereof, there is shown an integrated electrical circuit having field-effect transistors 20, 30 and 40 that are situated on a semiconductor substrate 10 preferably composed of silicon. The field-effect transistors 20, 30 and 40 each have source and drain regions 50, 60, 70, 80, 90 and 100 and also gate electrodes 120, 130 and 140.

An insulation layer 150 is situated between the field-effect transistors 20, 30 and 40 and also above the source and drain regions 50, 60, 70, 80, 90 and 100 and also between the gate electrodes 120, 130 and 140. The insulation layer 150 may be formed, in particular, by an intermediate oxide, for example a flowable planarization oxide such as borophosphorus silicate glass (BPSG). The intermediate oxide can be replaced by any other insulating material. However, the use of borophosphorus silicate glass has the particular advantage that, on account of its flowability, it may be possible to dispense with a process of chemical mechanical planarization for the purpose of producing a planar surface.

A blocker layer 160 having a thickness of 150 nm and made, for example, of silicon oxynitride SiON is disposed above the insulation layer 150. The blocker layer 160 is disposed above the entire surface of the semiconductor substrate 10 and is interrupted only in a region of contact holes 170, 180, 190, 200, 210 and 220. The contact holes 170, 180, 190, 200, 210 and 220 are preferably filled in a whole-area manner with a conductive material, for example a metal, preferably tungsten or a tungsten alloy.

Figure 2:
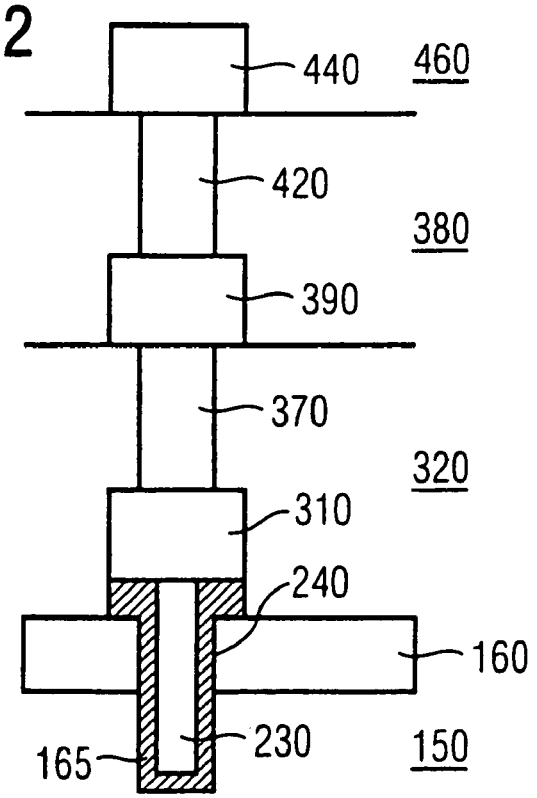
FIG. 2 is a detailed sectional view from FIG. 1 in a region of a filled contact hole.

As can be discerned from FIG. 2, an adhesion layer 165 having a thickness of approximately 100 nm and made of a titanium/titanium nitride alloy is situated between a tungsten filling 230 of a contact hole 240 and the layers which bound the contact hole, that is to say the insulation layer 150 and the blocker layer 160. The adhesion layer 165 serves as a seeding layer for subsequent deposition operations, in particular for the filling of the contact holes 170, 180, 190, 200, 210, 220 and 240 with tungsten, for example. In addition, the adhesion layer 165 protects the material underneath the bottom of the contact hole.

Above the contact holes 170, 180, 190, 200, 210, 220 and 240, connection pieces 250, 260, 270, 280, 290, 300 and 310 are situated directly on the blocker layer 160. The connection pieces being made of a material which combines a high conductivity with a minor diffusion tendency, for example aluminum.

A further insulation layer 320, which is also referred to as an intermetal oxide, is situated above and between the connection pieces 250, 260, 270, 280, 290, 300 and 310. However, it is not necessary for the insulation layer 320 to be composed of an oxide, although it is technologically particularly expedient for it to be composed of a semiconductor oxide such as, for example, $SiO_2$ formed by a TEOS (tetraethyl orthosilicate=$SiO(OC_2H_5)_4$) method. As an alternative, it is possible for the insulation layer 320 (that is to say the intermetal oxide in this case) to be deposited for example by a chemical vapor deposition (CVD) method. In all of the cases mentioned, the production of the insulation layer 320 can be integrated without difficulty in the process for fabricating the electrical circuit.

Contact holes 330, 340, 350, 360 and 370 are likewise etched into the insulation layer 320.

The contact holes 330, 340, 350, 360 and 370 are filled with tungsten or copper in a whole-area manner. Above the insulation layer 320, connection pieces 390 and 400 and also an interconnect 410 made of copper are situated in a further insulation layer 380.

Contact holes 420 and 430 are likewise situated in the insulation layer 380 and are in turn filled with tungsten or copper in a whole-area manner.

Connection pieces 440 and 450 made of copper are likewise disposed above the contact holes 420 and 430. The connection pieces 440, 450 are situated in an intermetal dielectric 460 which lies above the insulation layer 380 and is composed of a silicon oxide $SiO_2$, for example.

The integrated electrical circuit of this type can be produced in the manner explained below. The field-effect transistors 20, 30 and 40 with the source and drain regions 50, 60, 70, 80, 90 and 100 and also with the gate electrodes 120, 130 and 140 are fabricated in a known manner in the region of a main area of the semiconductor substrate 10.

This is followed by the production of the insulation layer 150, for example by the flowing of a flowable planarization oxide such as borophosphorus silicate glass (BPSG) or by a coating method such as plasma-enhanced CVD: PECVD (plasma enhanced chemical vapor deposition) method.

The blocker layer 160 having a thickness of approximately 100 nm is coated onto the insulation layer 150. The blocker layer 160—for example made of silicon oxynitride SiON—may preferably be fabricated by a PECVD method. A significant advantage of the PECVD method is that it can be carried out even at temperatures of below 500° C. In this case, free radicals are produced in a plasma. These are silicon, oxide and nitride radicals in the case of an SiON layer being deposited. Silane ($SiH_4$), ammonia ($NH_3$) and oxygen are used for carrying out the method. The blocker layer 160 is deposited at a pressure in the range of from about 20 to 100 Pa, preferably approximately 30 Pa, and a temperature below 500° C., preferably about 300° C.

Afterwards, the contact holes 170, 180, 190, 200, 210, 220 and 240 are etched into the insulation layer 150 and into the blocker layer 160, preferably by a dry etching method in a reactive plasma. An example of an etchant used is a gas mixture comprising $CHF_3$ and $O_2$ or containing $CHF_3$ and $CF_4$.

The adhesion layer 165 having a thickness of approximately 100 nm and made of a titanium/titanium nitride alloy is subsequently deposited. The contact holes 170, 180, 190, 200, 210, 220 and 240 are thereupon filled with tungsten or copper.

The connection pieces 250, 260, 270, 280, 290, 300 and 310 that may also be connecting elements, are subsequently applied for example by the sputtering and subsequent patterning of a metal layer.

A patterning process according to a conventional photolithographic method patterns that part of the adhesion layer 165 which lies above the blocker layer 160 and equally the connection pieces 250, 260, 270, 280, 290, 300 and 310.

The insulation layer 320 is then deposited onto the blocker layer 160 and the connection pieces 250, 260, 270, 280, 290, 300 and 310 by a suitable deposition method—such as plasma enhanced chemical vapor deposition (PECVD).

The contact holes 330, 340, 350, 360 and 370 are then etched into the insulation layer 320 preferably by a dry etching method in a reactive plasma. An example of a suitable etchant used is a gas mixture containing $CHF_3$ and $O_2$ or containing $CHF_3$ and $CF_4$.

The connection pieces 390 and 400 made of copper and also an interconnect 410, which serves for connecting the contact holes 350 and 360 and is likewise composed of copper, are produced in the manner explained below. A copper layer having a thickness of from 300 nm to 600 nm is applied to the layer 320 by a sputtering method. A resist mask is then applied and patterned by photolithographic process steps.

The insulation layer 380 is subsequently applied. The contact holes 420 and 430 are then etched into the insulation layer 380 preferably by a dry etching method in a reactive plasma. An example of an etchant used is once again a gas mixture containing $CHF_3$ and $O_2$ or containing $CHF_3$ and $CF_4$. The contact holes 420 and 430 are subsequently filled with copper. The connection pieces 440 and 450 made of copper are then applied to the contact holes 420 and 430.

A further plane 460 formed for example by an intermetal dielectric such as $SiO_2$ is subsequently applied.

Figure 3:
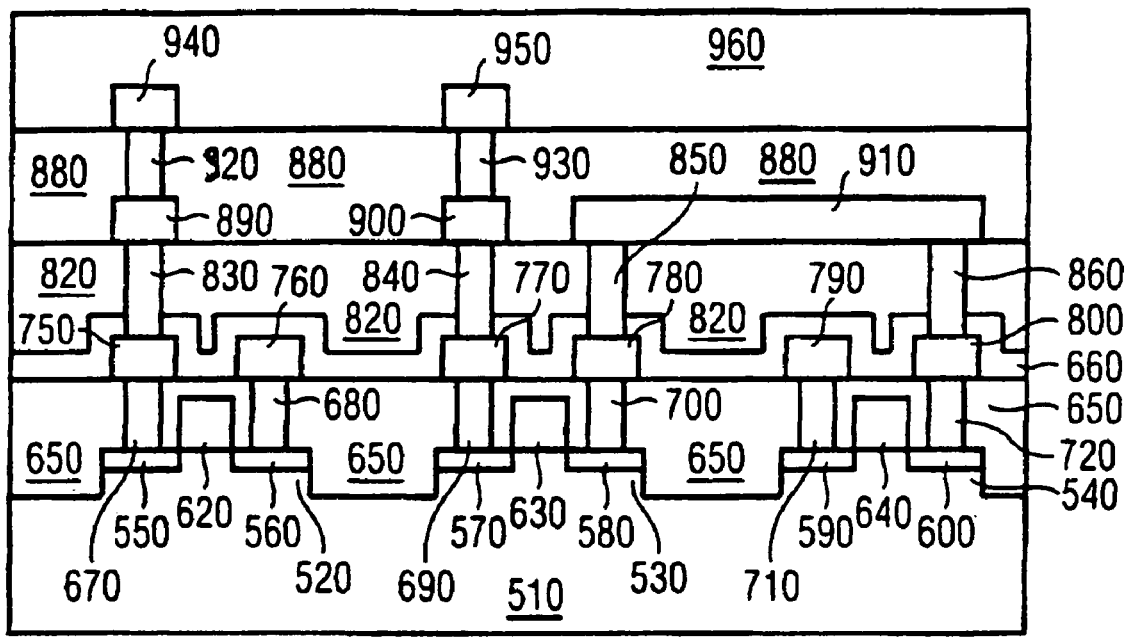
FIG. 3 is a sectional view of a second embodiment of the integrated electrical circuit having the blocker layer which is interrupted by the tungsten-filled contact holes and the connection pieces.

In the case of a second embodiment of the integrated electrical circuit illustrated in FIG. 3, field-effect transistors 520, 530 and 540 are situated on a semiconductor substrate 510 preferably composed of silicon. The field-effect transistors 520, 530 and 540 each have source and drain regions 550, 560, 570, 580, 590 and 600 and also gate electrodes 620, 630 and 640.

An insulation layer 650 is situated between the field-effect transistors 520, 530 and 540 and also above the source and drain regions and also the gate electrodes. The insulation layer 650 may be composed, in particular, of an intermediate oxide, for example a flowable planarization oxide such as borophosphorus silicate glass (BPSG). The intermediate oxide may be replaced by any other insulating material. However, the use of borophosphorus silicate glass has the particular advantage that, on account of its flowability, it may be possible to dispense with a process of chemical mechanical planarization for the purpose of producing a planar surface.

A blocker layer 660 having a thickness of 150 nm and made of silicon oxynitride SiON is disposed above the insulation layer 650. The blocker layer 660 is disposed above the entire surface of the semiconductor substrate 510 and encloses the connection pieces 750, 760, 770, 780, 790 and 800 located in the region of contact holes 670, 680, 690, 700, 710, 720 and 740. The contact holes 670, 680, 690, 700, 710 and 720 are preferably filled in a whole-area manner with a conductive material, for example a metal, preferably tungsten or a tungsten alloy. The connection pieces 750, 760, 770, 780, 790, 800 and 810 are composed of a material that combines a high conductivity with a minor diffusion tendency, for example aluminum.

Figure 4:
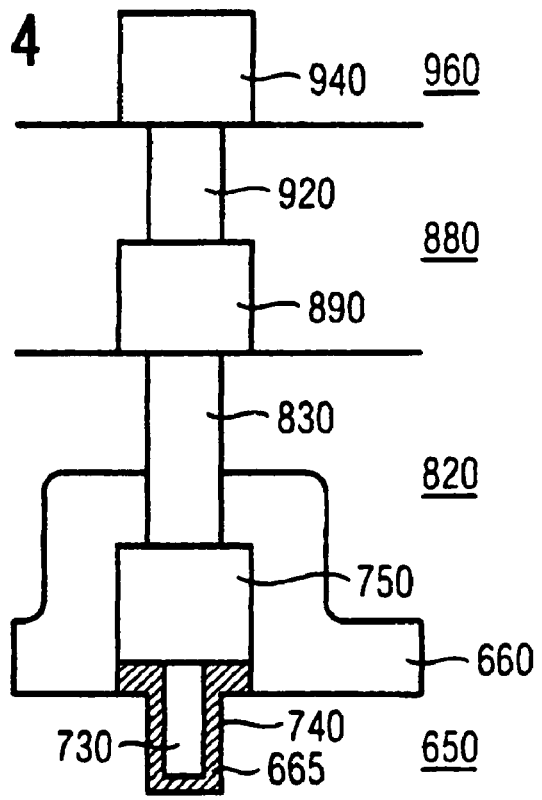
FIG. 4 is a sectional view of a detail shown in FIG. 3 in the region of the contact hole.

As can be discerned from FIG. 4, an adhesion layer 665 having a thickness of approximately 100 nm and made of a titanium/titanium nitride alloy is situated between the tungsten filling 730 of a contact hole 740 and the layer which bounds the contact hole, that is to say in this case the insulation layer 650. The adhesion layer 665 serves as a seeding layer for subsequent deposition operations, in particular for the filling of the contact holes 670, 680, 690, 700, 710, 720 and 740 with tungsten, for example. In addition, the adhesion layer 665 protects the material underneath the bottom of the contact hole.

A further insulation layer 820, which is also referred to as an intermetal oxide, is situated above and between the connection pieces 750, 760, 770, 780, 790, 800. However, it is not necessary for the insulation layer 820 to be composed of an oxide, although it is technologically particularly expedient for it to be composed of a semiconductor oxide such as, for example, $SiO_2$ formed by a TEOS (tetraethyl orthosilicate=$SiO(OC_2H_5)_4$) method. As an alternative, it is possible for the insulation layer 820 (that is to say the intermetal oxide in this case) to be deposited for example by a chemical vapor deposition (CVD) method. In all of the cases mentioned, the production of the insulation layer 820 can be integrated without difficulty in the process for fabricating the electrical circuit.

Contact holes 830, 840, 850 and 860 are likewise etched into the insulation layer 820.

The contact holes 830, 840, 850 and 860 are filled with tungsten or copper in a whole-area manner. Above the insulation layer 820, connection pieces 890 and 890 and also an interconnect 910 made of copper are situated in a further insulation layer 880.

Contact holes 920 and 930 are likewise situated in the insulation layer 880 and are in turn filled with tungsten or copper in a whole-area manner.

Connection pieces 940 and 950 made of copper are likewise disposed above the contact holes 920 and 930.

An integrated electrical circuit of this type can be produced in the manner explained below. The field-effect transistors 520, 530 and 540 with the source and drain regions 550, 560, 570, 580, 590 and 600 and also with the gate electrodes 620, 630 and 640 are fabricated in a known manner in the region of a main area of a semiconductor substrate 510.

This is followed by the production of the insulation layer 650, for example by the flowing of a flowable planarization oxide such as borophosphorus silicate glass (BPSG) or by a coating method such as plasma-enhanced CVD: PECVD (plasma enhanced chemical vapor deposition) method.

Afterwards, the contact holes 670, 680, 690, 700, 710, 720 and 740 are etched into the insulation layer 650, preferably by a dry etching method in a reactive plasma. An example of an etchant used is a gas mixture containing $CHF_3$ and $O_2$ or containing $CHF_3$ and $CF_4$.

The adhesion layer 665 having a thickness of approximately 100 nm and made of a titanium/titanium nitride alloy is subsequently deposited. The contact holes 670, 680, 690, 700, 710, 720 and 740 are thereupon filled with tungsten or copper.

The connection pieces 750, 760, 770, 780, 790 and 800, which may also be connecting elements, are subsequently applied for example by the sputtering and subsequent patterning of a metal layer made of aluminium or an aluminium alloy, for example. A patterning process according to a conventional photolithographic method patterns that part of the adhesion layer 665 which lies above the insulation layer 650 and equally the connection pieces 750, 760, 770, 780, 790 and 800.

The blocker layer 660 having a thickness of approximately 100 nm is then coated onto the insulation layer 650 and the connection pieces 750, 760, 770, 780, 790 and 800. The blocker layer 660—for example made of silicon oxynitride SiON—may preferably be fabricated by a PECVD method. A significant advantage of the PECVD method is that it can be carried out even at temperatures of below 500° C. In this case, free radicals are produced in a plasma. These are silicon, oxide and nitride radicals in the case of an SiON layer being deposited. Silane ($SiH_4$), ammonia ($NH_3$) and oxygen are used for carrying out the method. The blocker layer 660 is preferably deposited at a pressure in the range of about 20 to 100 Pa, ideally at about 30 Pa, and a temperature of below 500° C., preferably about 300° C.

The connection pieces 750, 760, 770, 780, 790 and 800 are subsequently produced by applying and subsequently patterning a metal layer. The insulation layer 820 is then deposited onto the blocker layer 660 and the connection pieces 750, 760, 770, 780, 790, 800 and 810 by a suitable deposition method such as chemical vapor deposition (CVD). The contact holes 830, 840, 850, 860 and 870 are then etched into the insulation layer 820. An example of an etchant used is a gas mixture containing $CHF_3$ and $O_2$ or containing $CHF_3$ and $CF_4$.

The connection pieces 890 and 900 made of copper and also an interconnect 910, which serves for connecting the contact holes 850 and 860 and is likewise composed of copper, are produced in the manner explained below. A copper layer having a thickness of from 300 nm to 600 nm is applied to the insulation layer 820 by a sputtering method. A resist mask is then applied and patterned by photolithographic process steps.

The further insulation layer 880 is then deposited. The contact holes 920 and 930 are then etched into the insulation layer 880 preferably by a dry etching method in a reactive plasma. An example of an etchant used is again a gas mixture containing $CHF_3$ and $O_2$ or containing $CHF_3$ and $CF_4$. The contact holes 920 and 930 are subsequently filled with copper. Connection pieces 940 and 950 made of copper are then applied to the contact holes 920 and 930.

The intermetal dielectric 960, for example made of silicon oxide $SiO_2$, is subsequently applied.

What is claimed is:

1. An integrated electrical circuit, comprising:
   a plurality of structure planes including at least one element structure plane;
   electrically active elements disposed on said at least one element structure plane;
   a first insulation layer disposed above said at least one element structure plane;
   said first insulation layer having first contact holes disposed therein, and said first contact holes being filled with a metal;
   a second insulation layer disposed above said first insulation layer;
   said second insulation layer having second contact holes disposed therein and filled with electrical connecting leads, and said second contact holes being further filled with copper in a whole-area manner;
   connection pieces disposed underneath said electrical connecting leads and above said first contact holes;
   at least one diffusion blocker disposed underneath said electrical connecting leads, said diffusion blocker at least one of impeding and preventing a diffusion of copper, said diffusion blocker configured as a blocker layer interrupted only in a region having said first contact holes formed therein, said blocker layer disposed between said first insulation layer and said second insulation layer; and
   said connection pieces being made of aluminum and covering said first contact holes and contacting said connection leads, and said connection pieces being covered by said second insulation layer.

2. The integrated electrical circuit according to claim 1, including a diffusion barrier for impeding a diffusion of copper disposed at at least one of a surface of said first contact holes and said connection pieces.

3. The integrated electrical circuit according to claim 1, wherein said electrical connecting leads have a copper content that is at least 10 percent by weight.

4. The integrated electrical circuit according to claim 1, wherein said insulation layer contains at least one substance selected from the group consisting of semiconductor oxides, semiconductor nitrides, fluorinated semiconductor oxides, fluorinated (amorphous) carbon, nitrides including boron nitride, polymers and polymer compounds including polyimides, polystyrenes, polyethylenes, polycarbonates, polybenzoxazole (PBO), benzocyclobutene (BCB), parylene, and fluoropolymers.

5. The integrated electrical circuit according to claim 1, wherein said blocker layer contains one of nitrogen, oxygen, fluorine, and a compound thereof.

6. The integrated electrical circuit according to claim 5, wherein said blocker layer contains a nitride.

7. The integrated electrical circuit according to claim 6, wherein said blocker layer contains one of silicon nitride $Si_3N_4$ and tungsten silicon nitride $WSi_xN$.

8. The integrated electrical circuit according to claim 5, wherein said blocker layer contains an oxidized nitride.

9. The integrated electrical circuit according to claim 8, wherein said blocker layer contains at least one compound selected from the group consisting of silicon oxynitride SiON, silicon boron oxynitride SiBON, titanium oxynitride $TiN_xO_y$, tantalum oxynitride $TaN_xO_y$, and tungsten oxynitride $WN_xO_y$.

10. The integrated electrical circuit according to claim 5, wherein said blocker layer contains a fluorinated nitride.

11. The integrated electrical circuit as claimed in claim 10, wherein said blocker layer contains silicon fluorooxynitride SiOFN.

12. The integrated electrical circuit according to claim 5, wherein said blocker layer contains a metal oxide.

13. The integrated electrical circuit according to claim 5, wherein said blocker layer contains a material selected from the group consisting of titanium oxide $TiO_2$ and tantalum oxide $Ta_2O_5$.

14. The integrated electrical circuit according to claim 1, wherein said blocker layer has a thickness of between 50 nm and 800 nm.

15. The integrated electrical circuit according to claim 1, wherein said blocker layer is one of a plurality of blocker layers.

16. The integrated electrical circuit according to claim 15, wherein said blocker layers are disposed on different ones of said structure planes.

17. The integrated electrical circuit according to claim 15, wherein an extent to which said blocker layers impede diffusion and prevent diffusion differs.

18. The integrated electrical circuit according to claim 1, including at least one further diffusion blocker bearing on at least a portion of said electrical connecting leads.

19. The integrated electrical circuit according to claim 18, wherein said further diffusion blocker bears on at least one of side areas and lower edges of said portion of said electrical connecting leads.

20. The integrated electrical circuit according to claim 18, wherein said further diffusion blocker prevents bulk outdiffusion of copper into said first insulation layer.

21. The integrated electrical circuit according to claim 18, wherein an extent to which said blocker layer impedes diffusion is greater than that of said further diffusion blocker.

22. The integrated electrical circuit according to claim 18, wherein said blocker layer has a thickness greater than that of said further diffusion blocker.

23. The integrated electrical circuit according to claim 18, wherein a diffusion through said blocker layer is less than 10% of a diffusion through said further diffusion blocker.

24. The integrated electrical circuit according to claim 1, wherein said blocker layer includes an upper surface facing said second insulation layer and a lower surface facing said structure plane, said connection pieces being in contact with said upper surface of said blocker layer.

25. The integrated electrical circuit according to claim 1, wherein said blocker layer includes an upper surface facing said second insulation layer and a lower surface facing said structure plane, said connection pieces being in contact with said lower surface of said blocker layer.

26. A method for fabricating an integrated electrical circuit, which comprises:
    forming a plurality of structure planes including at least one element structure plane;
    forming electrically active elements on the at least one element structure plane;
    applying a first insulation layer above the at least one element structure plane, the first insulation layer having first contact holes disposed therein, and the first contact holes being filled with a metal;
    applying a second insulation layer above the first insulation layer, the second insulation layer having second contact holes disposed therein and filled with electrical connecting leads, and the second contact holes being further filled with copper in a whole-area manner;
    applying connection pieces underneath the electrical connecting leads and above the first contact holes;
    applying at least one diffusion blocker underneath the electrical connecting leads, the diffusion blocker at least one of impeding and preventing a diffusion of copper, the diffusion blocker configured as a blocker layer interrupted only in a region having the first contact holes formed therein, the blocker layer disposed between the first insulation layer and the second insulation layer; and
    wherein the connection pieces are made of aluminum and cover the first contact holes and contact the connection leads, and the connection pieces are covered by the second insulation layer.

* * * * *